United States Patent [19]

Ishimoto

[11] Patent Number: 5,210,442
[45] Date of Patent: May 11, 1993

[54] PORTABLE TYPE MEMORY DEVICE

[75] Inventor: Shin-ichi Ishimoto, Itami, Japan

[73] Assignee: Mitsubishi Denki Kabushiki Kaisha, Tokyo, Japan

[21] Appl. No.: 779,041

[22] Filed: Oct. 18, 1991

[30] Foreign Application Priority Data

Oct. 18, 1990 [JP] Japan .................. 2-277859

[51] Int. Cl.⁵ .................. G06K 19/06; H05K 9/00
[52] U.S. Cl. .................. 257/679; 235/492; 235/490; 257/730
[58] Field of Search .................. 357/74, 70, 72; 235/490, 492; 257/679, 730, 678

[56] References Cited

U.S. PATENT DOCUMENTS

| | | | |
|---|---|---|---|
| 4,780,791 | 10/1988 | Morita et al. | 361/395 |
| 4,872,091 | 10/1989 | Maniwa et al. | 361/424 |
| 4,926,034 | 5/1990 | Banjo et al. | 235/492 |
| 5,017,767 | 5/1991 | Mizuno | 235/492 |

FOREIGN PATENT DOCUMENTS

| | | |
|---|---|---|
| 2609820 | 7/1988 | France . |
| 64-8877 | 2/1989 | Japan . |
| 2193606 | 2/1988 | United Kingdom . |
| 2243493 | 10/1991 | United Kingdom . |

Primary Examiner—Eugene R. LaRoche
Assistant Examiner—Viet Q. Nguyen
Attorney, Agent, or Firm—Leydig, Voit & Mayer

[57] ABSTRACT

A portable memory device has a lead of a ground terminal of a connector extending and bent to contact a conductive cover. When static electricity is applied to the memory device, it is conducted to the ground terminal and, thus, electric current caused by a static discharge is not supplied to parts within the device so that latch up of IC and loss or discharge of stored data is prevented.

5 Claims, 3 Drawing Sheets

PORTABLE TYPE MEMORY DEVICE

BACKGROUND OF THE INVENTION

1. Field of the Invention

The present invention relates to a portable memory device and, more particularly, to an IC card with anti-ESD (Electrostatic Discharge) means.

2. Description of the Related Art

FIG. 3 is a side sectional view of a conventional portable memory device, for example, an IC card. The IC card 1 has a connector 2 engaged with a terminal device (not illustrated) at one end of the IC card 1. Conductive outer panels 4 with interior surfaces coated with an insulating material 3 are provided on the upper and lower surfaces of the IC card 1. The outer panels 4 are spaced apart by an IC card frame 5 at predetermined interval. A substrate 6 which includes peripheral ICs 8 such as chip parts 7 and a memory IC is disposed in the IC card 1. The ground of the substrate 6 is connected to a lead 10 (a ground pin) of a ground terminal of the connector 2 through a ground line 9 and other electric circuits are connected to a connector pin 11. The conductive outer panels 4 have the same electric potential since these panels are electrically connected to each other through conductive members 12 placed between the panels, such as a plate spring, a coil spring and so on. The IC card 1 includes a battery 13 which is electrically connected to each part on the substrate 6 through a positive electrode terminal 14 and a negative electrode terminal 15.

Conventional IC card 1 has a configuration as described above. The IC card 1 is supplied with electricity from the terminal device (not illustrated) when it is inserted into the terminal device, and inputs and outputs data. When the IC card 1 is withdrawn from the terminal device after the data has been written in it, the IC card 1 is supplied with electricity from the battery 13 and retains data even if the memory IC is a volatile memory IC. If the memory IC is a non-volatile memory IC, supplying of electricity from the battery 13 is not required.

If the above mentioned IC is electrostatically charged when inserted into or withdrawn from the terminal device, there arises a large electric field (electric potential difference) between the conductive outer panel 4 and the wiring, the chip parts 7, the peripheral ICs 8 or other parts on the substrate 6. This large electric field may generate a static discharge between such parts and cause latch up of the peripheral ICs, including the memory IC or change in data caused by a malfunction of the memory IC and the like.

SUMMARY OF THE INVENTION

Accordingly, an object of the present invention is to provide a portable memory device for preventing discharge between conductive outer panels and parts mounted on a substrate when static electricity is generated and also preventing latch up of the ICs or change in stored data caused by a malfunction and so on of the ICs.

In order to achieve the above objects, according to one aspect of the present invention, there is provided a portable memory device comprising: a substrate; an IC mounted on the substrate; a pair of conductive covers disposed covering both faces of the substrate; a frame attached to one end of each of the pair of covers for supporting the covers; and a connector connected to other ends of the pair of covers for engaging a terminal device, the connector having a ground terminal lead and another terminal lead, an inner end of the ground terminal lead being extended and bent for contacting the cover.

DESCRIPTION OF THE PREFERRED EMBODIMENT

Figure 1:
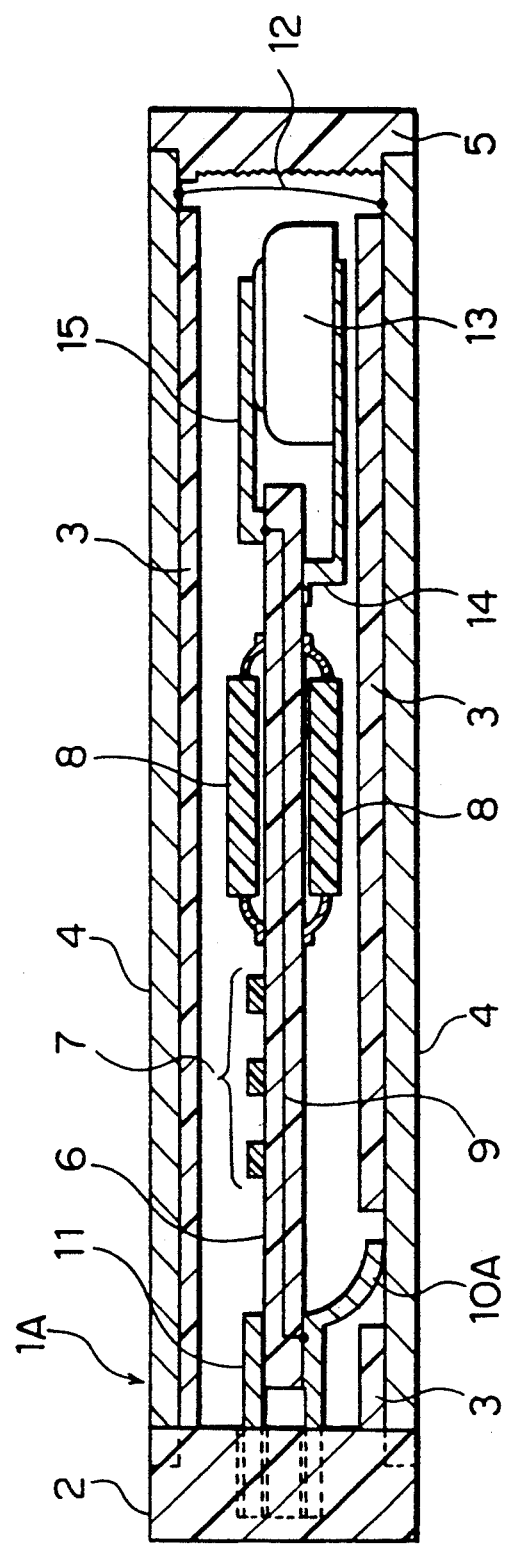
FIG. 1 is a side sectional illustration of an IC card according to one embodiment of the present invention.

FIG. 1 is a side sectional illustration of an IC card of according to one embodiment of the present invention. Numerals 2-9 and 11-15 denote the same parts as in the above mentioned conventional portable memory device. A distal end 10A of a lead of a ground terminal attached to a connector 2 is extended to contact the conductive outer panel 4 where the insulating material 3 has been removed, whereby allowing to conduct electricity.

The portable memory device such as an IC card has a configuration as mentioned above. The conductive outer panel 4 is charged when any static electricity is applied to the IC card (for instance, when a person who has been charged holds the IC card 1A in his hand). Although the conductive outer panel 4 is charged, the conductive panel 4 supplies an electric charge from itself to the lead 10A of a ground terminal of the substrate 6 since the outer panel 4 is in contact with the lead 10A of the ground terminal of the connector 2. Such an electric charge supply decreases the electric potential between the conductive outer panel 4 and the substrate 6, whereby a static discharge is prevented. Thus, latch up of the peripheral ICs 8, including the memory IC, and a change in stored data due to a malfunction of the memory IC, which are caused by static discharge, are prevented. Since the distal end of the lead of the ground terminal is in electrical contact with the conductive outer panel 4, the IC card in this invention does not require any other specific materials for preventing such above problems and can be readily made.

The above mentioned embodiment is applied to the portable memory device and also to other devices which have a connector for engaging a terminal device and have also a conductive outer cover member. The lead 10A of the ground terminal is connected with one of the conductive outer panels 4.

Figure 2:
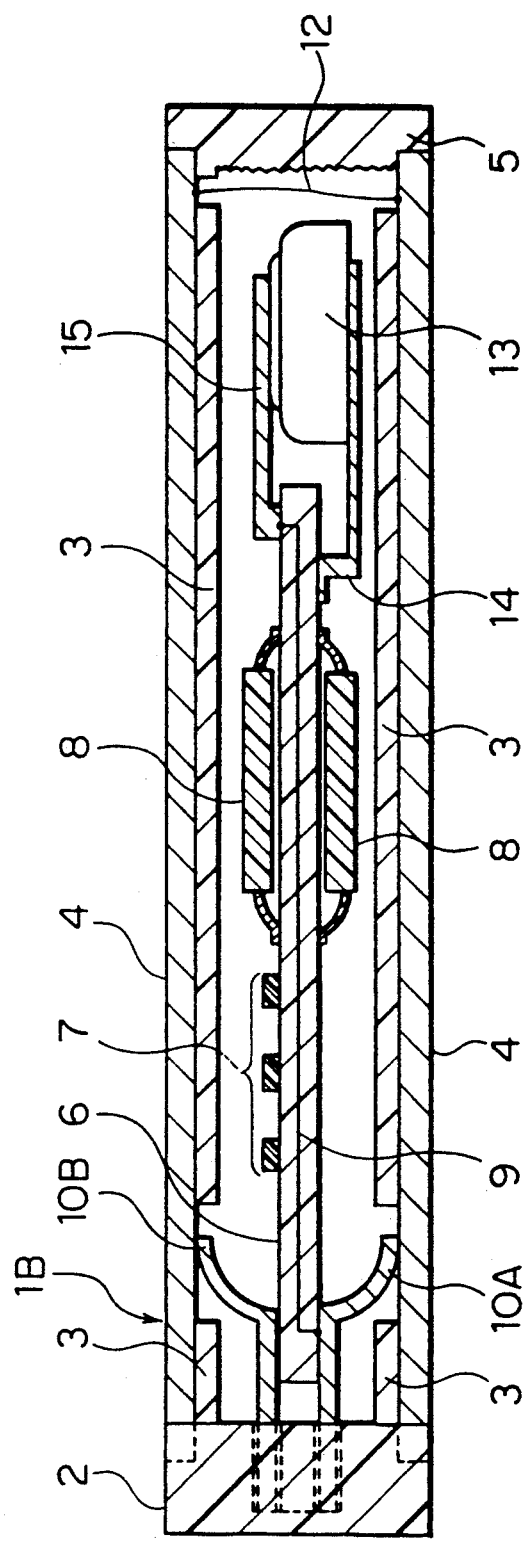
FIG. 2 is a side sectional illustration of the IC card of according to another embodiment of the present invention.
Figure 3:
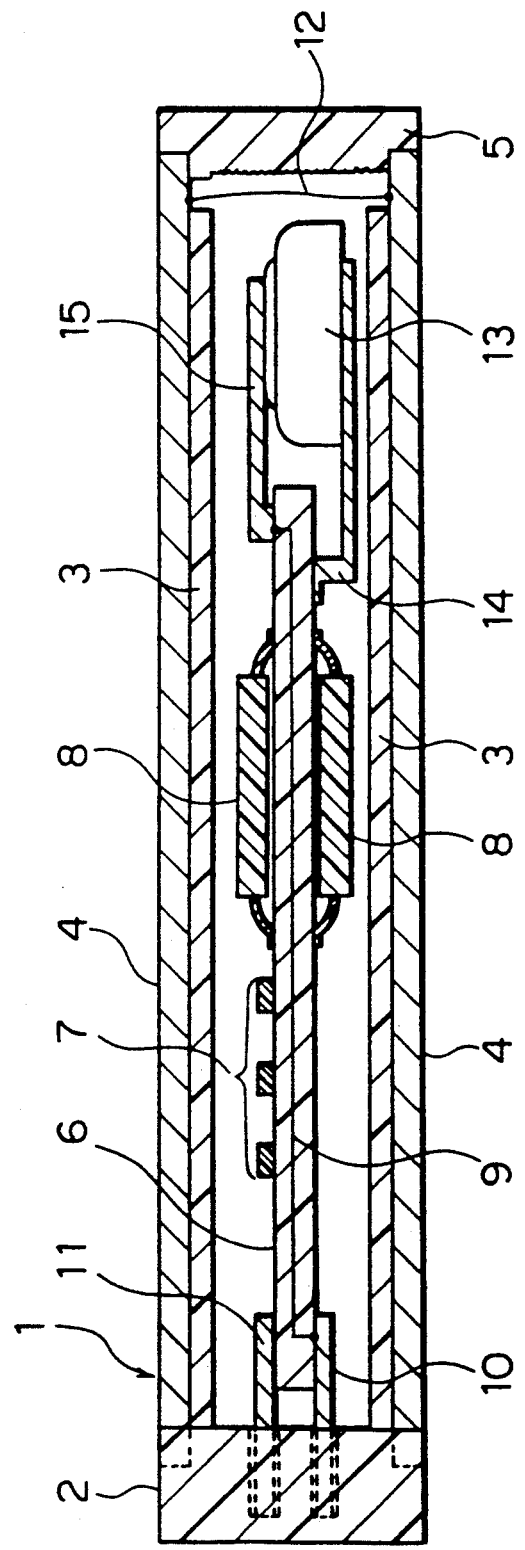
FIG. 3 is a side sectional illustration of a conventional IC card.

There is another embodiment wherein both leads 10A, 10B are connected, respectively, to the conductive outer panels as shown in FIG. 2. This arrangement can shorten conductive members 12 between panels and also prevent electrostatic discharge effectively. An illustration of a connector pin is omitted in FIG. 2. An battery 13 is not required when a non-volatile memory is employed as an memory IC. The portable memory device in this invention can be applied in such case.

In the above embodiments, the lead 10A of the ground terminal is connected to a ground line 9 of the substrate 6 and also contacts the conductive outer panel 4.

A specified pin other than the lead 10A of the ground terminal may be provided and may contact only the conductive outer panel 4 without connecting to any connecting terminals of the substrate 6.

What is claimed is:

1. A portable memory device comprising:
   a substrate having opposed faces and opposed first and second sides and an electrically conductive ground line;
   an IC mounted on said substrate;
   a pair of conductive covers, each cover having opposed first and second ends, said covers respectively covering said opposed faces of said substrate;
   a frame attached to the first end of each of said pair of covers and supporting said pair of covers; and
   a connector mounted on the second end of each of said pair of covers for engaging a terminal device, said connector having a plurality of leads including a ground terminal lead and at least one other terminal lead connected to said IC, said ground terminal lead being connected to said ground line, bent away from said substrate toward, extending to, and contacting one of said covers.

2. A portable memory device as claimed in claim 1 wherein said ground terminal lead contacts both of said covers.

3. A portable memory device as claimed in claim 1 wherein said IC is an IC memory.

4. A portable memory device as claimed in claim 5 wherein said IC memory is a volatile memory and including a battery disposed within said memory.

5. A portable memory device as claimed in claim 5 wherein said IC memory is a non-volatile memory and no battery is disposed within said memory.

* * * * *